(12) United States Patent
Helgenberg et al.

(10) Patent No.: US 6,601,932 B1
(45) Date of Patent: Aug. 5, 2003

(54) CLOSE-OFF FOR USE WITH AN EQUIPMENT RACK

(75) Inventors: John A Helgenberg, Paoli, PA (US); Terry W. Louth, Narvon, PA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 10/200,862

(22) Filed: Jul. 23, 2002

(51) Int. Cl.[7] ............................................... A47G 29/00
(52) U.S. Cl. ..................................... 312/265.4; 211/26
(58) Field of Search ........................... 312/265.1, 265.2, 312/265.3, 265.4, 265.5, 265.6; 211/26; 248/222.52, 222.11, 221.11

(56) References Cited

U.S. PATENT DOCUMENTS

| | | | |
|---|---|---|---|
| 5,325,263 A | 6/1994 | Singer et al. | 361/863 |
| 5,353,198 A | 10/1994 | Kabat et al. | 361/802 |
| 5,783,777 A | 7/1998 | Kruse et al. | 174/66 |
| 5,975,659 A * | 11/1999 | Yang et al. | 312/223.2 |
| 5,992,808 A * | 11/1999 | Morrow | 248/222.52 |
| D436,837 S | 1/2001 | Beal et al. | 518/700 |
| 6,285,548 B1 | 9/2001 | Hamlet et al. | 361/695 |

OTHER PUBLICATIONS

US 2002/0179,548 A1, Inventor Rinderer, Pub. Date Dec. 5, 2002.*

* cited by examiner

*Primary Examiner*—Ramon O. Ramirez
(74) *Attorney, Agent, or Firm*—Mark T. Starr; Gary M. Cohen; Michael B. Atlass

(57) ABSTRACT

A low-cost, self-contained close-off for a cabinet is formed as a generally planar body which is provided with integrated hardware for facilitating the attachment of the close-off to the cabinet, and subsequent detachment of the close-off from the cabinet. The planar body preferably incorporates an embossed region for providing the close-off with structural integrity, and is preferably fitted with integrated latches for securing the close-off to the cabinet. Support features are also preferably mated with the planar body including guide pins and embossed locators for positively locating the close-off relative to the cabinet at a proper height and in a correct orientation.

36 Claims, 6 Drawing Sheets

CLOSE-OFF FOR USE WITH AN EQUIPMENT RACK

BACKGROUND OF THE INVENTION

This invention generally relates to racks and other types of chassis for receiving equipment, including but not limited to electronic equipment and the like, and more particularly, to an apparatus for closing off portions of a rack which are not currently being used.

Any of a variety of support frames have been used to receive, and support in desired position, a plurality of circuit boards, modules or similar equipment. Such support frames are often referred to as "racks" or "chassis", which can be used to develop a housing (or cabinet) for receiving desired equipment.

Such cabinets are generally comprised of a series of framing elements that are combined to develop a desired enclosure for the equipment which is to be received in the resulting structure. To this end, a series of brackets is connected between a pair of support plates to develop an open enclosure for receiving desired equipment. For a rack system, top and bottom support plates are connected by a series (often four) of generally vertically oriented framing brackets. For a chassis system, an opposing pair of support plates are connected by a series (often four) of generally horizontally oriented framing brackets. In any event, the framing brackets are then provided with a series of holes for cooperating with equipment which is to be received in the resulting cabinet.

In practice, it has been found to be desirable to enclose cabinets of this general type. For example, it has been found to be important to maintain an effective flow of air through the cabinet, for purposes of cooling the housed equipment. It is also generally desirable to provide the cabinet with a finished look, to provide the cabinet with an aesthetically pleasing overall appearance.

It is common for portions of a resulting cabinet to be filled with equipment, and for other portions of the cabinet to be unfilled. Filled portions of the cabinet are enclosed and finished by the equipment which is received. Unfilled portions of the cabinet are traditionally provided with simulated closures, such as "face plates" or "dummy plates", for completing the facing of the cabinet. In the description which follows, these simulated closures will be referred to as a "close-off", with the understanding that such close-offs can have any of a variety of configurations, for use in combination with any of a variety of cabinet types and configurations.

A variety of different devices have been developed to close off unused or open areas in a cabinet (rack or chassis) to help promote the effective circulation of air within the cabinet and to provide a uniform surface that is aesthetically pleasing.

A commonly used close-off device generally takes the form of a plate having laterally positioned apertures for alignment with holes in the framing brackets of the cabinet. Screws, or similar fasteners, are then passed through the apertures of the plate, for engagement with the holes in the framing brackets, to secure the plate to an opening in the cabinet. While effective for purposes of closing off unused or open areas in the cabinet, to help promote the effective circulation of air within the cabinet, such close-off devices are not very pleasing in terms of their aesthetics.

For this reason, more elaborate close-off devices have been developed. For example, injection molded parts have been used, which tends to provide a greater degree of flexibility in design and which, as a result, tends to be more aesthetically pleasing. Shaped metal structures can also be used to provide a similar result. In practice, however, such assemblies tend to be unacceptably expensive.

Existing close-off devices also tend to require the use of additional hardware for purposes of being mounted to the framing brackets of the cabinet. This can include hardware for aligning the close-off within the cabinet, and relative to the framing brackets, and hardware for joining the close-off with the framing brackets. In any event, this often requires the use of separate, and plural, pieces of hardware, which can increase installation times and hinder removal of the close-off should the need arise. Separate hardware also has the potential to become separated from the close-off, or lost.

SUMMARY OF THE INVENTION

In accordance with the present invention, a close-off is provided which is relatively inexpensive and simple in construction, and which is self-contained to avoid the need for separate mounting hardware.

In its preferred embodiment, the close-off is formed as a generally planar body which is provided with integrated hardware for facilitating the attachment of the close-off to a cabinet, and subsequent detachment of the close-off from the cabinet. The planar body can be stamped from a sheet of material, such as thin sheet metal stock, or can be molded from a suitable plastic material. The planar body preferably incorporates an embossed region, for providing the close-off with structural integrity, and is preferably fitted with integrated latches for securing the close-off to the cabinet. Support features are also preferably mated with the planar body including guide pins and embossed locators for positively locating the close-off relative to the cabinet at a proper height and in a correct orientation.

DETAILED DESCRIPTION OF THE INVENTION

Figure 1:
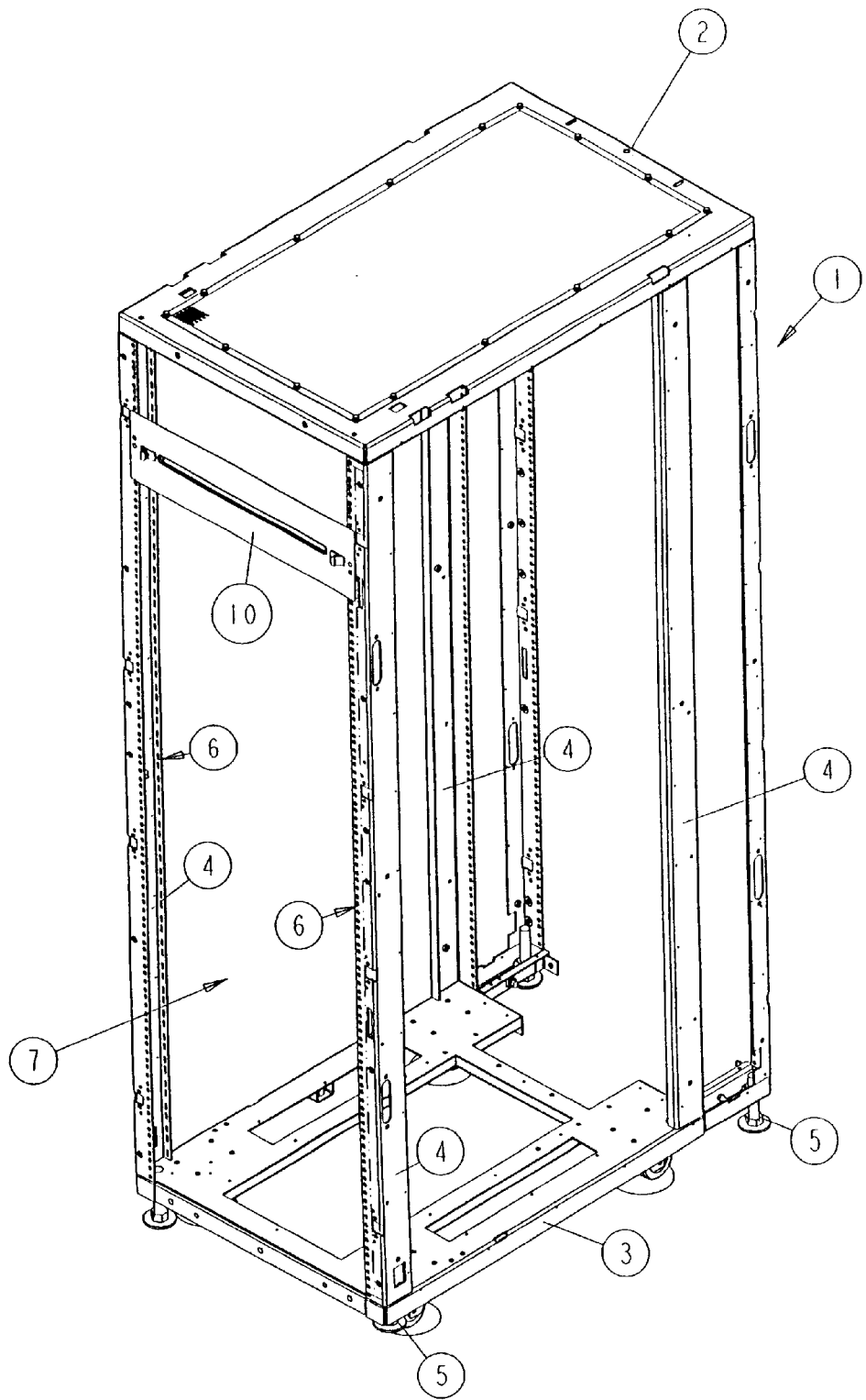
FIG. 1 is an isometric view of a cabinet including a close-off produced in accordance with the present invention, attached to front face portions of the cabinet.

FIG. 1 illustrates a cabinet 1 of a type and configuration which is generally known in the industry. The cabinet 1 is comprised of plural framing elements including a top plate 2, a bottom plate 3 and a series of brackets 4 connecting and extending between the top plate 2 and the bottom plate 3. The bottom plate 3 is preferably provided with a series of adjustable feet 5, which can be used to seat the cabinet 1 on a desired surface and to permit the attitude of the cabinet 1 to be adjusted, primarily for purposes of leveling the cabinet 1 on its supporting surface. The top plate 2 and/or the bottom plate 3 can be provided with ducts, plenums and fans (not shown), for purposes of establishing a cooling air flow through the cabinet 1 in applications where such cooling is desired.

Each of the brackets 4 is provided with a series of spaced holes 6. The holes 6 are used to receive desired components (not shown), and to secure such components to the brackets 4 and within an enclosure 7 which is defined by the cabinet 1. The holes 6 can be provided with spacings placed in accordance with an industry-defined standard, such as the standards which are specified by the Electronic Industries Association, or proprietary spacings that are matched to the particular components to be housed within the cabinet 1.

The cabinet 1 shown in FIG. 1 has brackets 4 that are generally vertically oriented, developing a rack for vertically stacking a series of horizontally oriented components. It is equally possible for the brackets to be placed in a generally horizontal orientation, to develop a chassis for receiving a series of generally vertically oriented components in a side-by-side relationship. It is even possible for a vertically oriented rack to receive one or more horizontally oriented chassis, if desired.

In any event, it is to be understood that the foregoing structures are generally known in the industry, and that such structures have only been described as examples of the many different configurations that can be developed to receive components in a cabinet-type structure. It is also to be understood that, although the close-off of the present invention is described in conjunction with these illustrative cabinet structures, the close-off of the present invention can equally be used with other types of cabinets, including cabinet structures that may be developed in the future.

FIG. 1 also shows a close-off 10 which has been produced in accordance with the present invention, mated to the cabinet 1. The placement for the close-off 10 is entirely arbitrary, and has been selected for purposes of illustration only. Generally, the close-off 10 would be placed to enclose a region in the enclosure 7 which is not to house a component, but which is instead to remain empty. Although only one close-off 10 has been shown, for purposes of simplification, it is to be understood that the cabinet 1 can be fitted with as many close-offs as are appropriate or desired for a particular application.

Figure 2:
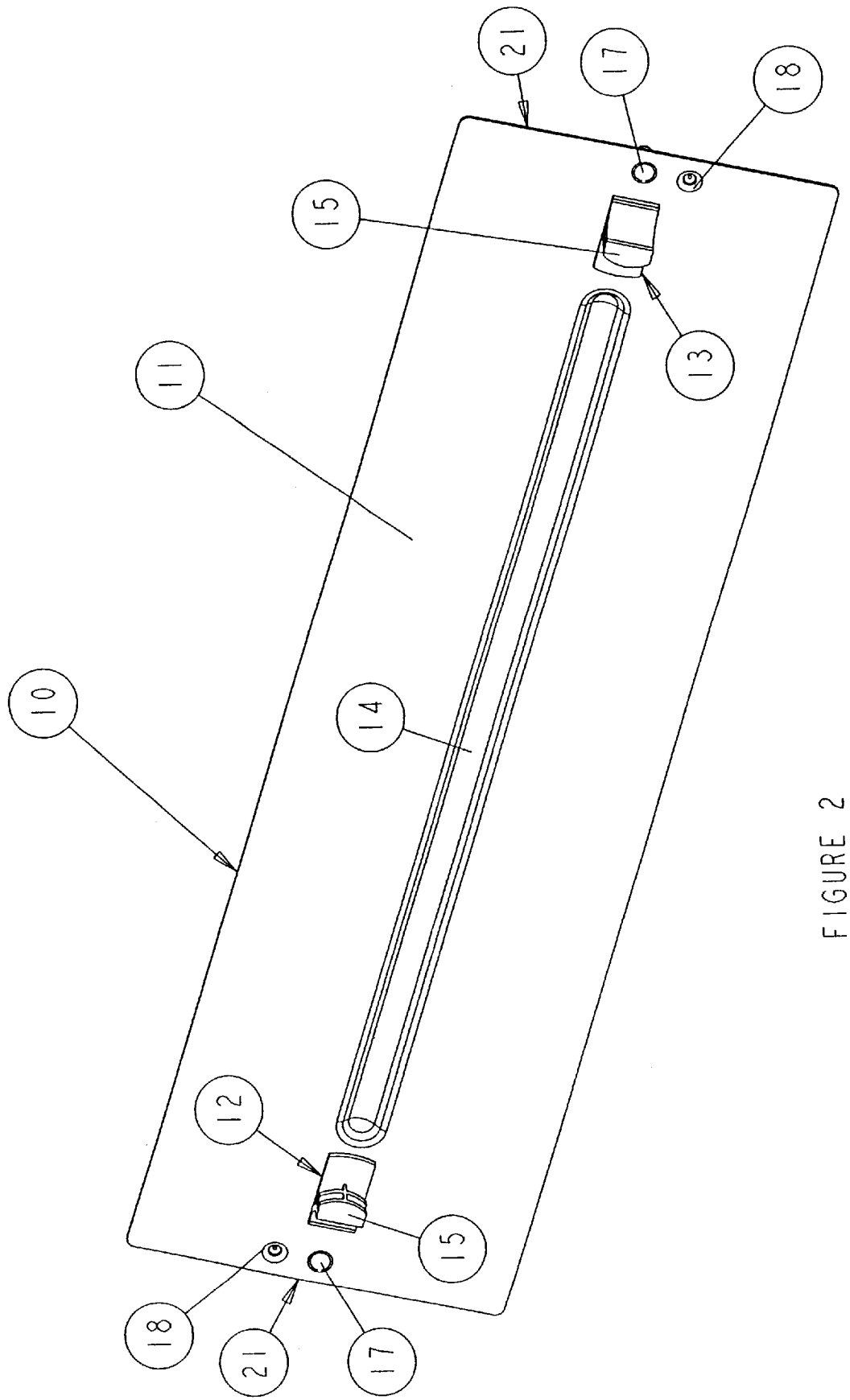
FIG. 2 is an isometric view of the close-off shown in FIG. 1, viewed from the front.
Figure 3:
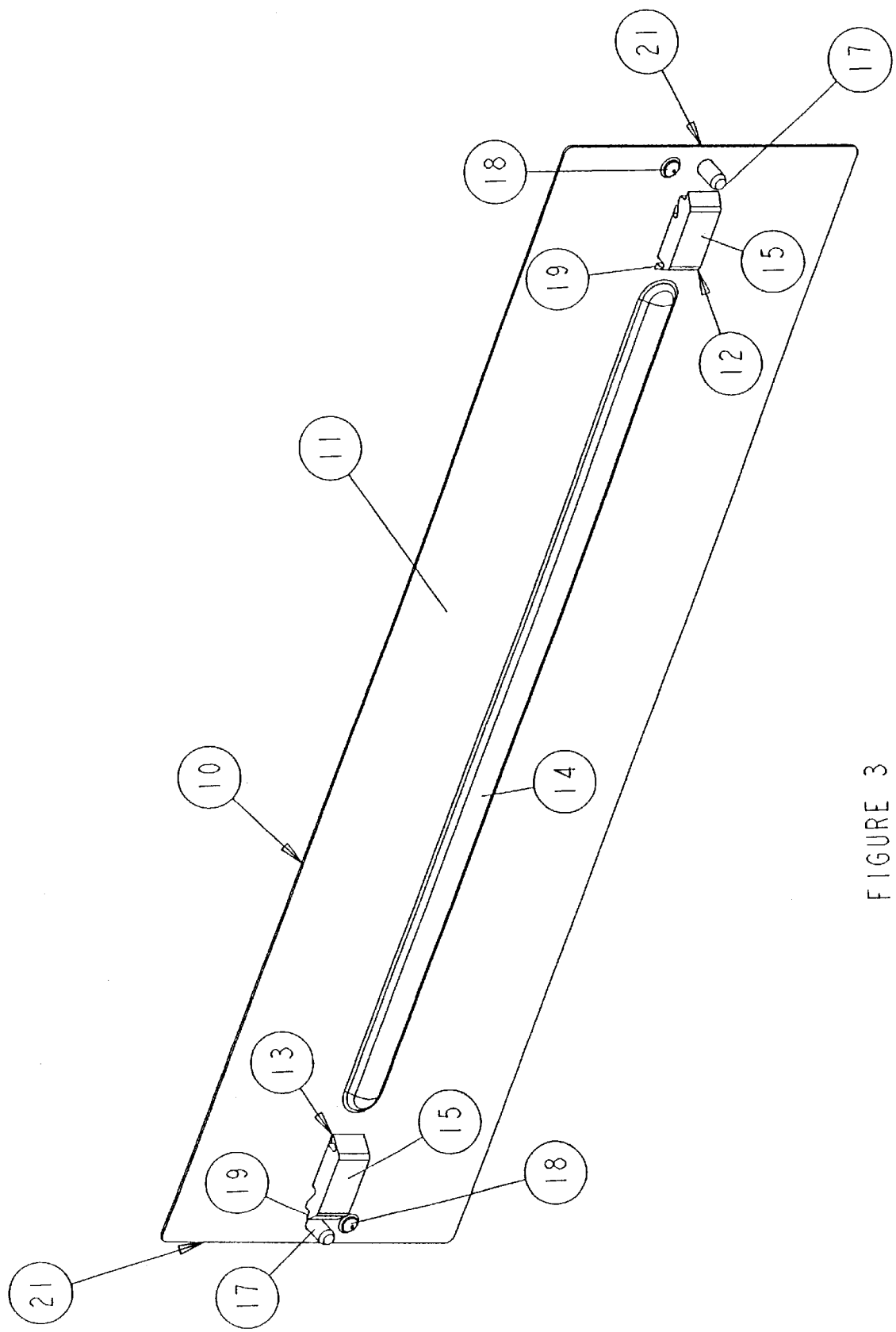
FIG. 3 is an isometric view of the close-off shown in FIG. 1, viewed from the rear.
Figure 4:
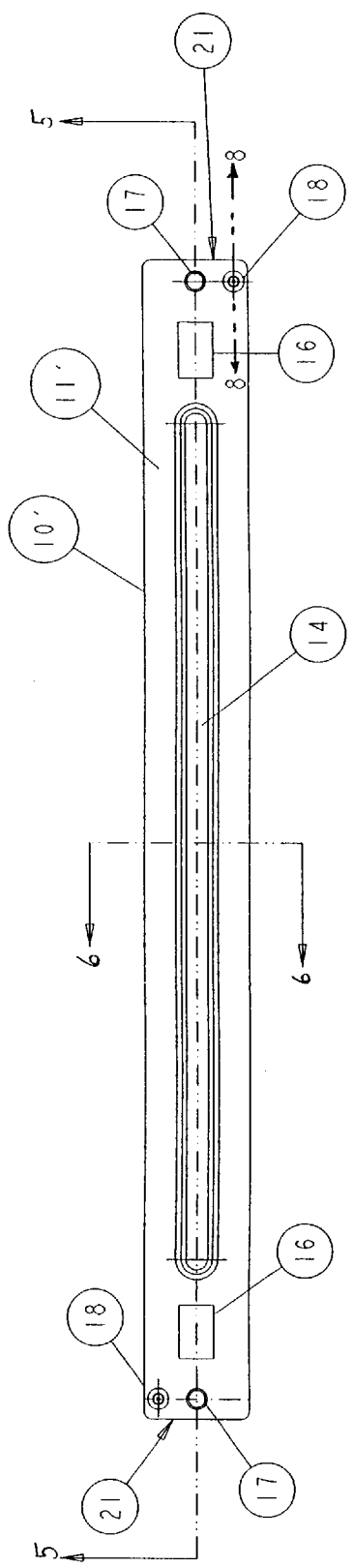
FIG. 4 is a plan view of an alternative embodiment of the close-off shown in FIG. 1, having a different overall configuration and with the mounting latches removed.
Figure 5:
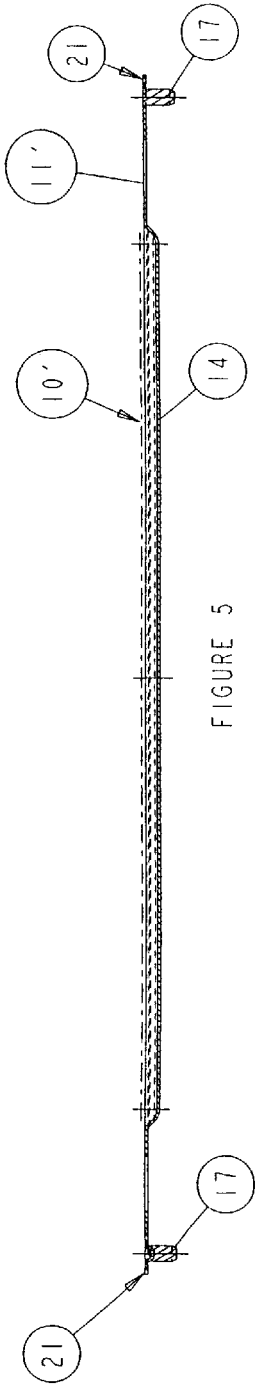
FIG. 5 is a sectional view of the close-off shown in FIG. 4, taken along the line 5—5.
Figure 6:
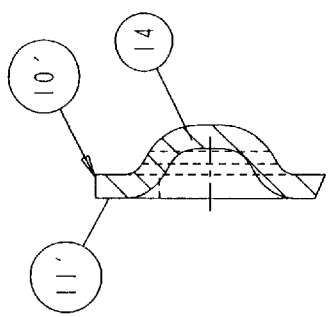
FIG. 6 is a sectional view of the close-off shown in FIG. 4, taken along the line 6—6.

As previously indicated, the series of holes 6 in the brackets 4 are preferably provided with spacings placed in accordance with an industry-defined standard, such as the Electronic Industries Association (EIA)-31 0-C standard. The close-offs are then preferably produced in different sizes corresponding to the specified standard. For example, the close-off 10 shown in FIG. 1, and in greater detail in FIGS. 2 and 3, is shown in a commonly used "3U" size, while the close-off 10' shown in FIGS. 4, 5 and 6 is shown in a correspondingly smaller "1U" size. The close-off of the present invention can also be adapted to other sizes, and size increments, if desired.

Irrespective of size, the close-off 10 (or 10') is formed as a generally planar body 11 (or 11') which is provided with mounting hardware 12, 13 for facilitating the attachment of the close-off 10, 10' to the cabinet 1, and subsequent detachment of the close-off 10, 10' from the cabinet 1. The planar body 11, 11' is preferably stamped from a suitable sheet of material, such as thin sheet metal stock. The planar body 11, 11' can also be molded from a suitable plastic material, for example, by vacuum forming a sheet of a thermoplastic material, or formed in place, using a material such as fiberglass.

The planar body 11, 11' preferably incorporates at least one embossed region 14 for providing the close-off 10, 10' with structural integrity. The embossed region 14 can be developed using any of a variety of known methods, which will be selected responsive to varying factors including the material which forms the planar body 11, 11' and the overall configuration selected for the embossed region 14.

The close-off 10, 10' has been shown with a single, longitudinally oriented, centrally located embossed region 14, which is presently considered preferred for reasons of simplicity. It is also possible to position an embossed region at other locations on the planar body 11, 11', and to provide the planar body 11, 11' with plural embossed regions, if desired. It is preferable for the embossed region 14 to extend substantially longitudinally along the planar body 11, 11', for reasons of structural strength, although other orientations can also be implemented.

The mounting hardware 12, 13 is preferably integrated with the planar body 11, 11' by combining a cooperating pair of latches 15 with a pair of apertures 16 formed in the planar body 11, 11'. Any of a variety of known and available latch mechanisms can be used for this. A preferred latch mechanism, which is shown in the drawings for illustrative purposes only, is the Model A3-60-519-25 Slide Latch which is available from Southco, Inc. of Concordville, Pa. This spring-mounted sliding latch has the advantages of being fully integrated and rectangular in profile, which is then readily mated with easily manufactured, rectangular apertures 16. Other types of latch mechanisms can also be used, if desired.

The close-off 10, 10' is additionally and preferably provided with one or more features projecting from the planar body 11, 11' for facilitating alignment and mounting of the close-off, as will discussed more fully below.

A pair of guide pins 17 are preferably located at opposing ends of the close-off 10, 10', in general alignment with the longitudinal center line of the close-off. An opposing pair of guide pins 17 will generally suffice for purposes of aligning the close-off with the holes 6 of the brackets 4, although a single guide pin, or additional pairs of such guide pins, can also be used if desired. Any of a variety of known and available guide pins can be used for this. A preferred guide pin, which is shown in the drawings for illustrative purposes only, is the Model TPS-250-8 Flush Mounted, Self-clinching Pilot Pin which is available from Penn Engineering and Manufacturing Corp. of Danboro, Pa. This guide pin has the advantages of being well suited to simple, flush-mounted connection to the planar body 11, 11'. Other types of guide pins can also be used, if desired.

A pair of embossed locators 18 are also preferably located at opposing ends of the close-off 10, 10'. As is best shown in FIGS. 2 to 4, the embossed locators 18 are preferably offset relative to the guide pins 17, and are symmetrically placed relative to each other, on opposing sides of the longitudinal center line of the close-off. An opposing pair of embossed locators 18 will generally suffice for purposes of aligning the close-off with the holes 6 of the brackets 4, although a single embossed locator, or additional pairs of such embossed locators, can also be used if desired. The embossed locators 18 can be developed using any of a variety of known methods, but are preferably formed using the same process which is used to form the embossed region 14. In this way, the embossed locators 18 can be formed together with the embossed region 14, in a single operation.

Figure 7:
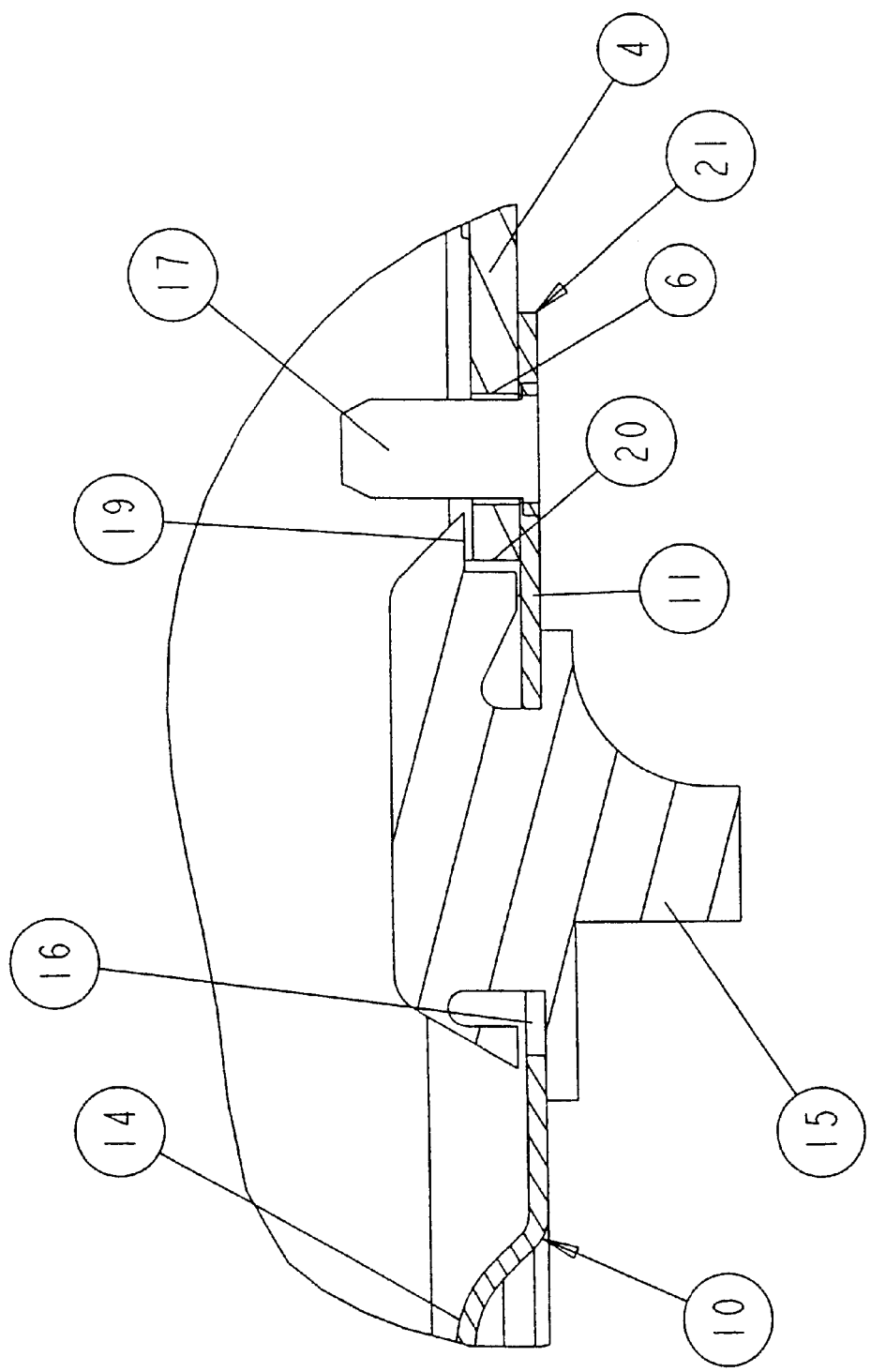
FIG. 7 is an enlarged, partial cross-sectional view, viewed along portions of the line 6—6 in FIG. 4, showing interaction between the latching and alignment features of the close-off and the framing brackets of the cabinet.
Figure 8:
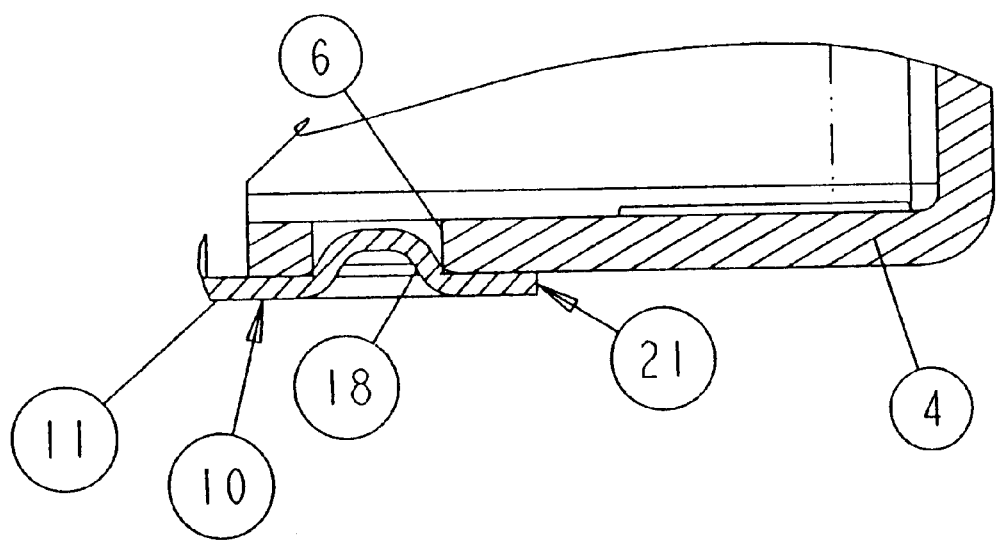
FIG. 8 is an enlarged, partial cross-sectional view, taken along the line 8—8 in FIG. 4, also showing interaction between the latching and alignment features of the close-off and the framing brackets of the cabinet.

The guide pins 17 and the embossed locators 18 are primarily provided for purposes of positively locating the close-off 10, 10' relative to the cabinet 1, at a proper height and in a correct orientation. Interaction between the close-off 10 and one of the brackets 4 of the cabinet 1 is shown with reference to FIGS. 7 and 8.

The close-off 10 is placed over an opening in the cabinet 1 which is to be enclosed, in general alignment with the opening. Rough alignment of the close-off 10 over the opening is achieved by slidingly engaging the guide pins 17 with the appropriate holes 6 in the brackets 4, which can be sighted during the installation process. As the close-off 10 is moved forward, to engage the holes 6 in the brackets 4, the embossed locators 18 will approach the brackets 4, entering other holes 6 in the brackets 4 as the close-off 10 is correctly positioned over (aligned within) the opening to be closed off. The latches 15 are at this point retracted (simultaneously drawn toward the center of the close-off), allowing the catches 19 of the latches 15 to pass the edges 20 of the brackets 4. As the embossed locators 18 come to be seated in the holes 6 of the brackets 4, placing the ends 21 of the close-off 10 in contact with the brackets 4, the latches 15 are released, causing the catches 19 to surround the edges 20 of the brackets 4 and securely engage the brackets 4. The latches 15 are easily grasped during the entire process, and the structural integrity imparted to the close-off 10 by the embossed region 14 reduces flexing of the unit during assembly, and subsequently, when placed in use.

The catches 19 are preferably spaced from the planar body 11 by a distance which substantially corresponds to the thickness of the brackets 4. The embossed locators 18 will only enter the holes 6 of the brackets 4, bringing the ends 21 of the planar body 11 into contact with the brackets 4, upon correct alignment of the close-off 10 relative to the opening. An incorrect alignment of the embossed locators 18 relative to the holes 6 of the brackets 4 will prevent the ends 21 of the planar body 11 from coming into contact with the brackets 4, which will in turn prevent the latches 15 from closing over the brackets 4. In this way, the embossed locators 18 operate to automatically ensure that the installed close-off 10 has been aligned correctly.

As previously indicated, the symmetrically opposed location for the pair of embossed locators 18 which is shown in the figures is preferred. This is because, in practice, and following installation of the close-off 10, 10', it has been found that symmetrically positioned embossed locators 18 tend to minimize vibrational movements of the close-off. Such placement is also more convenient because such symmetry avoids the need to have to orient the close-off 10, 10' prior to installation. Although presently considered less preferred, it is also possible to place the embossed locators 18 in other relative positions, for example, in horizontally opposing positions, if desired.

As examples of the interaction between the structures of the close-off 10, 10' and the brackets 4 of the cabinet 1, let it be assumed that the cabinet 1 has been manufactured to an existing "EIA" hole pattern, such as the hole pattern which is specified in the Electronic Industries Association (EIA)-31 0-C standard. In such case, a unit commonly referred to as "1U" (the smallest unit used) will have a width of approximately 1.75 inches, and a length which can vary to suit the overall size of the cabinet 1. Widths of 19 inches and 24 inches are presently commonly use, although other sizes (smaller and greater) can also be used. For each unit, three holes 6 are provided, one which is located at the longitudinal center of the unit, and two others which are symmetrically located on either side of the centrally located hole, at a spacing of 0.625 inches. The guide pins 17 will be located in the centrally positioned holes, while the embossed locators 18 will be located in an opposing pair o f the surrounding holes. For larger units, such as a "3U" size, the pattern for the "1U" unit is preferably used and extensions are provided which laterally extend from the footprint of a basic "1U" unit to provide the additional width that is needed. As alternatives, the larger units can be produced as multiples of the basic "1U" unit, with multiple guide pins 17 and/or embossed locators 18, if desired.

The close-off 10, 10' can be adapted to other sizes, and size increments, if desired. For example, while the close-off 10, 10' has been described for production in the more common "1U" and "3U" sizes, the close-off can also be adapted to other sizes and increments. The close-off 10, 10' can also be used with any of a variety of cabinet frames, from various manufacturers, and that conform to current rack mount standards or standards that my later be developed. In any event, the close-off 10, 10' is easily modified to operate with different cabinet widths and/or heights. The resulting close-off is a cost effective alternative to prior covers for enclosing unused spaces in a cabinet, and contains all of the mechanisms required to secure the unit to the cabinet while avoiding the need for additional, or separate hardware.

It will, therefore, be understood that various changes in the details, materials and arrangement of parts which have been herein described and illustrated in order to explain the nature of this invention may be made by those skilled in the art within the principle and scope of the invention as expressed in the following claims.

What is claimed is:

1. A close-off for covering an open region of an enclosure, wherein the enclosure includes a plurality of brackets for developing the enclosure, wherein each of the brackets has a series of holes for mounting equipment within the enclosure, and wherein the close-off comprises:

a generally planar body having a shape which substantially corresponds to the open region of the enclosure;

mounting hardware received in and extending through at least one opening formed in the planar body, wherein the mounting hardware includes a catch for engaging portions of the brackets; and a plurality of bracket-engaging features projecting from the planar body, for engaging the holes in the brackets and for guiding the close-off into alignment over the open region.

2. The close-off of claim 1 wherein the mounting hardware and the plurality of features are integrated with the planar body.

3. The close-off of claim 1 wherein the planar body includes at least one embossed region formed in the planar body.

4. The close-off of claim 3 wherein the embossed region extends substantially longitudinally along the planar body.

5. The close-off of claim 1 wherein the catch of the mounting hardware engages the portions of the brackets when the features projecting from the planar body are in engagement with the holes in the brackets.

6. The close-off of claim 5 wherein the catch of the mounting hardware is prevented from engaging the brackets when the features projecting from the planar body are out of engagement with the holes in the brackets.

7. The close-off of claim 1 wherein the mounting hardware is a spring-mounted sliding latch.

8. The close-off of claim 1 wherein the mounting hardware is an opposing pair of latches extending through a pair of openings formed in the planar body, and wherein the latches includes catches for engaging an opposing pair of the brackets.

9. The close-off of claim 8 wherein the catches each have a frame-engaging surface which is separated from the planar body by a space which substantially corresponds to the bracket engaged by the latch.

10. The close-off of claim 1 wherein the features projecting from the planar body include an opposing pair of guide pins sized to slidingly engage the holes in the brackets.

11. The close-off of claim 10 wherein the guide pins are fixed to the planar body.

12. The close-off of claim 10 wherein the planar body has a longitudinally oriented center line, and wherein the opposing pair of guide pins are positioned along the center line of the planar body.

13. The close-off of claim 1 wherein the features projecting from the planar body include an opposing pair of locators extending from the planar body.

14. The close-off of claim 13 wherein the locators are embossed in the planar body.

15. The close-off of claim 13 wherein the locators are sized to engage the holes in the brackets.

16. The close-off of claim 13 wherein the planar body has a longitudinally oriented center line, and wherein the opposing pair of locators are positioned on opposing sides of the center line of the planar body.

17. The close-off of claim 16 wherein the locators are symmetrically positioned on the opposing sides of the center line of the planar body.

18. The close-off of claim 16 wherein the features projecting from the planar body additionally include an opposing pair of guide pins sized to slidingly engage the holes in the brackets, and wherein the locators are spaced from the guide pins by a distance corresponding to spacing of the holes in the brackets.

19. The close-off of claim 18 wherein the planar body has a longitudinally oriented center line, and wherein the opposing pair of guide pins are positioned along the center line of the planar body.

20. The close-off of claim 1 wherein the features projecting from the planar body are located on the planar body at positions corresponding to an the hole pattern specified in the Electronic Industries Association standard (EIA-31-0C).

21. The close-off of claim 1 wherein the plurality of bracket-engaging features project from the planar body and toward the holes in the brackets.

22. A close-off for covering an open region of an enclosure, wherein the enclosure includes a plurality of brackets for developing the enclosure, wherein each of the brackets has a series of holes for mounting equipment within the enclosure, and wherein the close-off comprises:

a generally planar body having a shape which substantially corresponds to the open region of the enclosure;

mounting hardware received in and extending through at least one opening formed in the planar body, wherein the mounting hardware includes a catch for engaging portions of the brackets; and at least one guide pin sized to slidingly engage the holes in the brackets, and at least one locator coupled with the guide pin and sized to engage the holes in the brackets, wherein the guide pin and the locator project from the planar body, for engaging the holes in the brackets and for guiding the close-off into alignment over the open region.

23. The close-off of claim 22 wherein the catch of the mounting hardware engages the portions of the brackets when the guide pin and the locator are in engagement with the holes in the brackets.

24. The close-off of claim 23 wherein the catch of the mounting hardware is prevented from engaging the brackets when the guide pin and the locator are out of engagement with the holes in the brackets.

25. The close-off of claim 22 wherein the mounting hardware is an opposing pair of latches extending through a pair of openings formed in the planar body.

26. The close-off of claim 25 wherein the latches includes catches having frame-engaging surfaces which are separated from the planar body by a space which substantially corresponds to the bracket engaged by the latch.

27. The close-off of claim 25 having an opposing pair of guide pins and an opposing pair of locators coupled with the planar body.

28. The close-off of claim 27 wherein the planar body has a longitudinally oriented center line, wherein the opposing pair of guide pins are positioned along the center line of the planar body, and wherein the opposing pair of locators are positioned on opposing sides of the center line of the planar body.

29. The close-off of claim 28 wherein the locators are symmetrically positioned on the opposing sides of the center line of the planar body.

30. The close-off of claim 22 wherein the guide pin and the locator are positioned on the planar body at locations corresponding to an Electronic Industries Association standard.

31. The close-off of claim 22 wherein the mountin hardware, the guide pin and the locator are integrated with the planar body.

32. A close-off for covering an open region of an enclosure, wherein the enclosure includes a plurality of brackets for developing the enclosure, wherein each of the brackets has a series of holes for mounting equipment within the enclosure, and wherein the close-off comprises:

a generally planar body having a shape which substantially corresponds to the open region of the enclosure;

an opposing pair of latches received in and extending through openings formed in the planar body, wherein each of the latches includes a catch for engaging portions of the brackets; and an opposing pair of guide pins sized to slidingly engage the holes in the brackets, and an opposing pair of locators coupled with the guide pins and sized to engage the holes in the brackets, wherein the guide pins and the locators project from the planar body, for engaging the holes in the brackets and for guiding the close-off into alignment over the open region.

33. The close-off of claim 32 wherein the planar body has a longitudinally oriented center line, wherein the opposing pair of guide pins are positioned along the center line of the planar body, and wherein the opposing pair of locators are positioned on opposing sides of the center line of the planar body.

34. The close-off of claim 33 wherein the locators are symmetrically positioned on the opposing sides of the center line of the planar body.

35. The close-off of claim 32 wherein the guide pins and the locators are positioned on the planar body at locations corresponding to an Electronic Industries Association standard.

36. The close-off of claim 32 wherein the latches, the guide pins and the locators are integrated with the planar body.

* * * * *